(12) United States Patent
Ike

(10) Patent No.: US 11,621,629 B2
(45) Date of Patent: Apr. 4, 2023

(54) DIAGNOSTIC APPARATUS FOR ELECTRIC DRIVE OBJECT

(71) Applicant: KABUSHIKI KAISHA YASKAWA DENKI, Kitakyushu (JP)

(72) Inventor: Hideaki Ike, Fukuoka (JP)

( * ) Notice: Subject to any disclaimer, the term of this patent is extended or adjusted under 35 U.S.C. 154(b) by 16 days.

(21) Appl. No.: 17/314,046

(22) Filed: May 7, 2021

(65) Prior Publication Data

US 2021/0278465 A1    Sep. 9, 2021

Related U.S. Application Data

(63) Continuation of application No. PCT/JP2019/043723, filed on Nov. 7, 2019.

(30) Foreign Application Priority Data

Nov. 9, 2018 (JP) .................. PCT/JP2018/041719

(51) Int. Cl.
| | |
|---|---|
| *H02P 27/08* | (2006.01) |
| *H02M 1/32* | (2007.01) |
| *F04D 25/06* | (2006.01) |
| *G01R 31/34* | (2020.01) |
| *H02P 23/14* | (2006.01) |

(52) U.S. Cl.
CPC .......... *H02M 1/32* (2013.01); *F04D 25/0666* (2013.01); *G01R 31/343* (2013.01); *H02P 23/14* (2013.01); *H02P 27/085* (2013.01)

(58) Field of Classification Search
CPC ... F04D 25/0666; G01R 31/343; H02P 23/14; H02P 27/085
See application file for complete search history.

(56) References Cited

U.S. PATENT DOCUMENTS 5,478,170 A * 12/1995 Hanamoto .............. E21D 9/093
                                                              405/184
5,819,202 A    10/1998 Sato et al.
(Continued)

FOREIGN PATENT DOCUMENTS

| CN | 108426691 | 8/2018 |
|---|---|---|
| EP | 3348835 | 7/2018 |

(Continued)

OTHER PUBLICATIONS

International Search Report dated Feb. 12, 2019 for PCT/JP2018/041719.

(Continued)

*Primary Examiner* — Rina I Duda
(74) *Attorney, Agent, or Firm* — Soei Patent & Law Firm

(57) ABSTRACT

A diagnostic apparatus for an electric drive object that generates a drive force in response to receiving electric power, the diagnostic apparatus includes a circuitry configured to: acquire time series force data associated with the drive force; identify a force oscillation level associated with the drive force based on the force data; set an oscillation threshold at a first level when the drive object operates at a first speed and set the threshold at a second level higher than the first level when the drive object operates at a second speed higher than the first speed; and identify an irregularity of the drive object in response to determining that the force oscillation level exceeds the oscillation threshold.

20 Claims, 8 Drawing Sheets

(56) References Cited

U.S. PATENT DOCUMENTS

| | | | | |
|---|---|---|---|---|
| 6,254,353 | B1* | 7/2001 | Polo | F04D 15/0281 |
| | | | | 73/152.01 |
| 6,340,339 | B1* | 1/2002 | Tabata | B60K 6/387 |
| | | | | 475/5 |
| 7,024,335 | B1* | 4/2006 | Parlos | G05B 23/0283 |
| | | | | 702/182 |
| 7,701,106 | B2* | 4/2010 | Yuratich | H02K 1/185 |
| | | | | 310/216.069 |
| 2010/0169030 | A1* | 7/2010 | Parlos | G01R 31/343 |
| | | | | 702/58 |
| 2017/0089192 | A1* | 3/2017 | Rendusara | F04D 13/10 |

FOREIGN PATENT DOCUMENTS

| | | |
|---|---|---|
| JP | S60-185078 | 12/1985 |
| JP | H6-165521 | 6/1994 |
| JP | H9-006432 | 1/1997 |
| JP | 2008-037255 | 2/2008 |
| JP | 2014-214642 | 11/2014 |
| JP | 2015-081693 | 4/2015 |
| JP | 2016-211780 | 12/2016 |
| JP | 2016-220302 | 12/2016 |
| JP | 2018-173333 | 11/2018 |

OTHER PUBLICATIONS

International Search Report dated Jan. 21, 2020 for PCT/JP2019/043723.
International Preliminary Report on Patentability with Written Opinion dated May 20, 2021 for PCT/JP2018/041719.
International Preliminary Report on Patentability with Written Opinion dated May 20, 2021 for PCT/JP2019/043723.
Extended Search Report in corresponding European Application No. 19882742.0, dated Jul. 8, 2022.

* cited by examiner

DIAGNOSTIC APPARATUS FOR ELECTRIC DRIVE OBJECT

CROSS-REFERENCE TO RELATED APPLICATIONS

This application is a continuation application of PCT Application No. PCT/JP2019/043723, filed on Nov. 7, 2019, which claims the benefit of priority from PCT Application No. PCT/JP2018/041719, filed on Nov. 9, 2018, the entire contents of which are incorporated herein by reference.

BACKGROUND

1. Field

The present disclosure relates to a power conversion apparatus, a pumping apparatus, a control method, a diagnostic apparatus, and a diagnostic method.

2. Description of the Related Art

Japanese Unexamined Patent Publication No. H6 (1994)-165521 discloses an inverter apparatus including means for quickly stopping the inverter apparatus and outputting an alarm when a motor current output to a motor for driving a pump decreases to reach a preset no-load motor current value and the motor current does not increase even after a lapse of a preset time.

SUMMARY

Disclosed herein is a diagnostic apparatus for an electric drive object that generates a drive force in response to receiving electric power, the diagnostic apparatus may include a circuitry configured to: acquire time series force data associated with the drive force; identify a force oscillation level associated with the drive force based on the force data; set an oscillation threshold at a first level when the drive object operates at a first speed and set the threshold at a second level higher than the first level when the drive object operates at a second speed higher than the first speed; and identify an irregularity of the drive object in response to determining that the force oscillation level exceeds the oscillation threshold.

Additionally, another example power conversion apparatus is disclosed herein. The power conversion apparatus may include the diagnostic apparatus. For example, the power conversion apparatus may include: power conversion circuitry configured to provide the electric power to the drive object; and control circuitry configured to control the power conversion circuitry and including the circuitry of the diagnostic apparatus.

Additionally, another example pumping apparatus is disclosed herein. The pumping apparatus may include the power conversion apparatus; and the drive object, which is an electric pump driven by the electric power provided by the power conversion apparatus.

Another example diagnostic method is disclosed herein. The diagnostic method may include: acquiring time series force data associated with the drive force; identifying a force oscillation level associated with the drive force based on the force data; setting an oscillation threshold at a first level when the drive object operates at a first speed and setting the threshold at a second level higher than the first level when the drive object operates at a second speed higher than the first speed; and identifying an irregularity of the drive object in response to determining that the force oscillation level exceeds the oscillation threshold.

DETAILED DESCRIPTION

Figure 1:
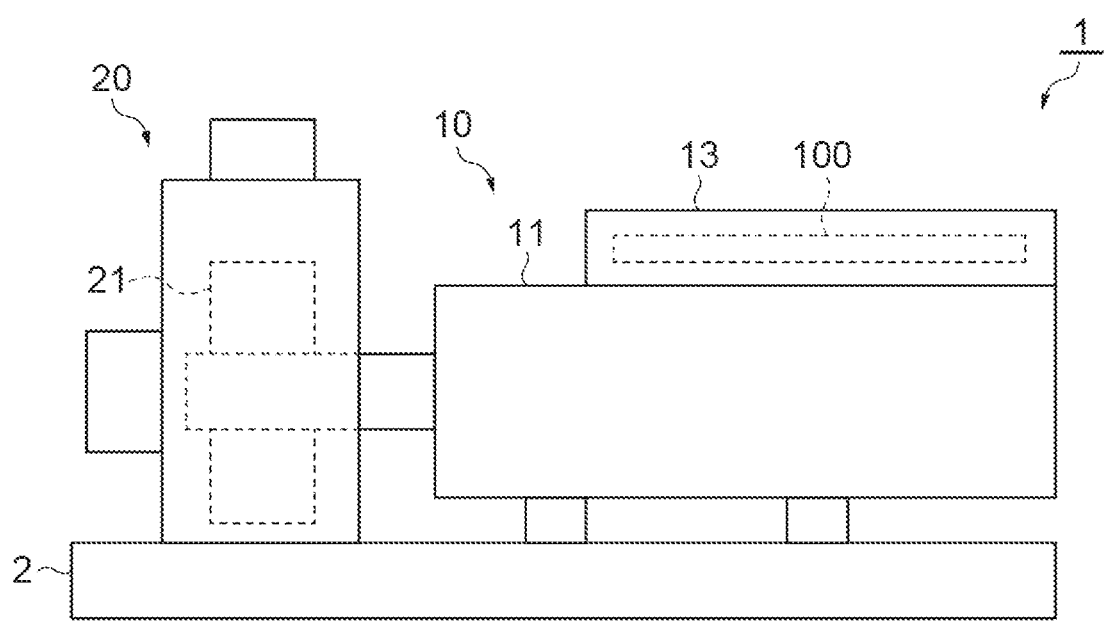
FIG. 1 is a side view of a pumping apparatus.

Hereinafter, with reference to the drawings, the same elements or similar elements having the same function are denoted by the same reference numerals, and redundant description will be omitted.

Pumping Apparatus

Overall Configuration

The pumping apparatus 1 shown in FIG. 1 includes a pump 20 configured to pump liquid, a pump driving apparatus 10 configured to drive the pump 20, and a unit base 2 configured to integrally hold these components.

The pump 20 is a non-positive displacement rotary pump. For example, the pump 20 is a centrifugal pump such as a spiral pump, and includes an impeller 21 that pumps liquid by centrifugal force. The pump 20 may be a positive displacement pump or a reciprocating pump such as a diaphragm pump or a bellows pump. The pump 20 may be any pump as long as the relationship between the operating speed and the drive force during the steady operation is reproducible.

The pump driving apparatus 10 includes a motor 11, a power conversion apparatus 100, and an electrical component holder 13. The motor 11 is a power source for driving the pump 20. Examples of the motor 11 include a rotary synchronous motor or an induction motor.

Figure 2:
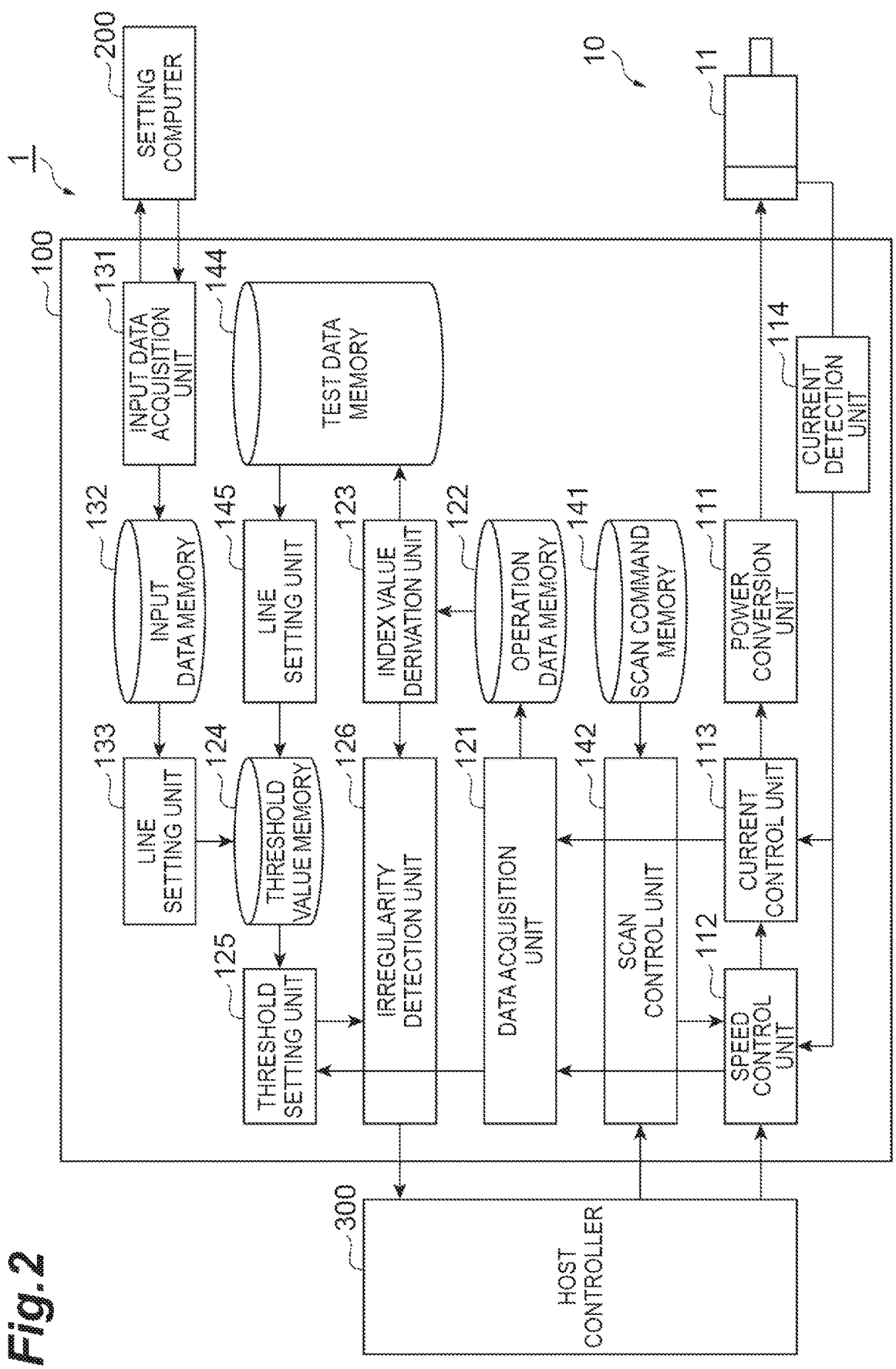
FIG. 2 is a block diagram illustrating a functional configuration of a power conversion apparatus.

The power conversion apparatus 100 generates alternating-current electric power to control a rotating speed of the motor 11 to follow a frequency command (speed command) received from a host controller 300 (see FIG. 2). The power conversion apparatus 100 may generate a frequency command by an internal operation instead of reception from the host controller 300, or may store a preset frequency command therein. The configuration of the power conversion apparatus 100 will be described in detail later.

The electrical component holder 13 is fixed to the motor 11 and holds the power conversion apparatus 100. For example, the electrical component holder 13 is a case fixed to the outer periphery of the frame of the motor 11 and holds the power conversion apparatus 100 therein.

Power Conversion Apparatus

The power conversion apparatus 100 is configured to: provide electric power to the pumping apparatus 1; acquire time series speed data associated with an operating speed of the pumping apparatus 1 and time series force data associated with a drive force of the pumping apparatus 1; derive (or identify) an amplitude index value (or force oscillation level) associated with an oscillation amplitude of the force data; set an oscillation threshold (a threshold of the amplitude index) at a first level when the pumping apparatus 1 operates at a first speed and set the threshold at a second level higher than the first level when the pumping apparatus 1 operates at a second speed higher than the first speed; and detect (or identify) an irregularity of the pumping apparatus 1 in response to determining that the amplitude index value exceeds the threshold. The pumping apparatus 1 includes an electric drive object that generates a drive force in response to receiving electric power. For example, as shown in FIG. 2, a power conversion apparatus 100 includes, as functional elements (here in after "functional modules"), a power conversion unit 111 (power conversion circuitry), a speed control unit 112, a current control unit 113, a current detection unit 114, a data acquisition unit 121, an operation data memory 122, an index value derivation unit 123, a threshold value memory 124, a threshold setting unit 125, and an irregularity detection unit 126.

The power conversion unit 111 (power conversion circuitry) is configured to output driving electric power to the motor 11 of the pumping apparatus 1. For example, the power conversion unit 111 is configured to output an alternating voltage having a frequency capable of following the magnetic pole of the motor 11 to the motor 11 at a voltage amplitude corresponding to a voltage command. For example, the power conversion unit 111 is configured to generate the alternating voltage by pulse width modulation (PWM). The power conversion unit 111 may be an inverter configured to convert direct-current electric power of a direct-current bus into alternating-current electric power to generate driving electric power, or may be a matrix converter configured to performs bidirectional electric power conversion between alternating-current electric power on an alternating power source side and alternating-current electric power on the motor 11 side.

The speed control unit 112 is configured to control the power conversion unit 111 to output driving electric power so that the driving speed of the pump 20 follows a target speed. For example, the speed control unit 112 is configured to control the power conversion unit 111 to change the electric power in order to modulate the operating speed of the pumping apparatus 1. The target speed is, for example, the frequency command received from the host controller 300. The target speed may be the frequency command generated by an internal operation of the power conversion apparatus 100 or may be the preset frequency command stored in the power conversion apparatus 100. The speed control unit 112 calculates a current command (torque command) for reducing a speed deviation.

The current control unit 113 is configured to calculate a voltage command for reducing a deviation between the current command calculated by the speed control unit 112 and a current (hereinafter, "output current") being output to the motor 11, and output the voltage command to the power conversion unit 111. Accordingly, the power conversion unit 111 outputs driving electric power to the motor 11 so that the operating speed of the pump 20 follows the target speed. The current detection unit 114 detects the output current from the power conversion unit 111 to the motor 11.

The data acquisition unit 121 is configured to acquire time series speed data associated with the operating speed of the pumping apparatus 1 and time series force data associated with the drive force of the pumping apparatus 1. The speed data may be any data as long as it is associated with the operating speed of the pumping apparatus 1 (for example, the rotating speed of the motor 11). Here, "associate" means that speed data increases or decreases in accordance with an increase or decrease in operating speed. Examples of the speed data include a command value of the rotating speed of the motor 11 or a frequency command value of alternating-current electric power provided to the motor 11. The speed data may be a detected value of the rotating speed of the motor 11 detected by a sensor such as a pulse generator.

The force data may be any data as long as it is associated with the drive force of the pumping apparatus 1 (e.g., the torque of the motor 11). Here, "associate" means that the force data increases or decreases in accordance with an increase or decrease in the drive force. An example of the force data may include time series data of an electrical current associated with the electric power. For example, the force data may include a detected value of current provided to the motor 11 (for example, a detected value by the current detection unit 114). The force data may include a command value of current provided to the motor 11 or may include time series measurements of the drive force. For example, the force data may include a torque detection value by a force sensor.

The operation data memory 122 is configured to store the speed data and the force data acquired by the data acquisition unit 121 in chronological order.

The index value derivation unit 123 is configured to derive (identify) the amplitude index value based on the force data stored in the operation data memory 122. The amplitude index value may be any data as long as it is associated with the oscillation amplitude of the force data. Here, "associate" means that the amplitude index value increases or decreases in accordance with an increase or decrease in the oscillation amplitude.

For example, the index value derivation unit 123 derives (or calculate) the oscillation amplitude of the force data as the amplitude index value based on a plurality of values of the force data acquired during a period (an evaluation period) from a predetermined length of time before an acquisition time of the force data to the acquisition time. The amplitude may be a width from a negative peak to a positive peak, or may be a half of the width from the negative peak to the positive peak. The oscillation is an oscillation of the force data in a steady operation of the pumping apparatus 1. The steady operation refers to an operation state in which the pump 20 is filled with liquid to be pumped (hereinafter simply referred to as "liquid") and the operating speed of the pump 20 substantially consistent with the target speed. Substantially consistent means that the difference between the operating speed and the target speed is within a negligible margin of error. The amplitude may be obtained from, for example, a difference between a maximum value and a minimum value within a predetermined time, or may be obtained by fast Fourier transform (FFT). For example, the index value derivation unit 123 may derive the amplitude of a predetermined frequency as the amplitude index value by FFT, or may derive an average value, a maximum value, or the like of the amplitude in a predetermined band of frequency as the amplitude index value.

The index value derivation unit 123 may calculate a trend value of the force data and derive (or calculate), as the amplitude index value, a difference between an instantaneous value of the force data and the trend value. For example, the index value derivation unit 123 may calculate the trend value based on past values of force data acquired during a period from a predetermined length of time before an acquisition time of the force data to the acquisition time. For example, the index value derivation unit 123 may derive (or calculate) the trend value by low-pass filtering on the force data. For example, the index value derivation unit 123 may derive the trend value by low-pass filtering using the past values of force data on the latest force data in the operation data memory 122.

As an example of the low-pass type filtering, there is a finite impulse response type filtering. When a first order filtering of the finite impulse response method is used, the trend value is derived by the following expression.

$$Y = A \cdot X[k] + (1-A) \cdot X[k-1] \quad (1)$$

Y: trend value
X [k]: latest force data
X [k−1]: previously acquired force data
A: filter coefficient When a second order filtering of the finite impulse response method is used, the trend value is derived by the following expression.

$$Y = A \cdot X[k] + B \cdot X[k-1] + (1-A-B) \cdot X[k-2] \quad (2)$$

Y: trend value
X [k]: latest force data
X [k−1]: previously acquired force data
X [k−2]: acquired force data two times before
A and B: filter coefficients The index value derivation unit 123 may not necessarily use the latest force data for calculating the trend value, and may calculate the trend value based only on the past values of force data. For example, X [k] may be force data acquired one or more (for example, one) times before the latest.

The threshold value memory 124 is configured to store a preset threshold line (or a threshold profile) representing a predetermined relationship between the operating speed of the pumping apparatus 1 (or the speed data) and the oscillation threshold (a threshold of the amplitude index value). Hereinafter, the threshold of the amplitude index value is referred to as "amplitude threshold". The amplitude threshold is, for example, an upper limit value that is set to a level at which it can be determined that the state is not normal when the amplitude threshold exceeds the value. The threshold value memory 124 may store the threshold line as a discrete point sequence arranged on the line, or may store the threshold line as a function.

Figure 3A:
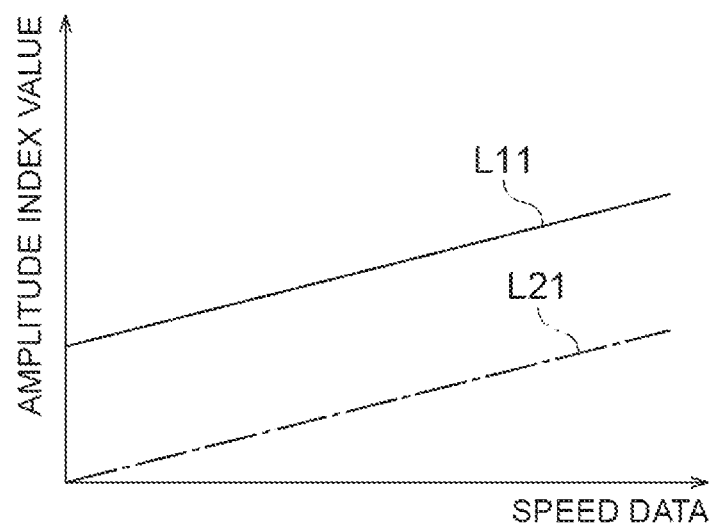
FIGS. 3A, 3B, and 3C are graphs illustrating threshold lines.
Figure 3B:
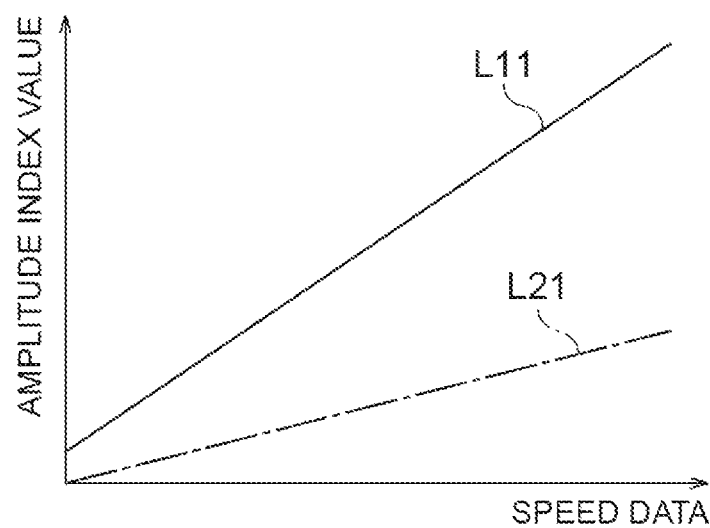
Figure 3C:
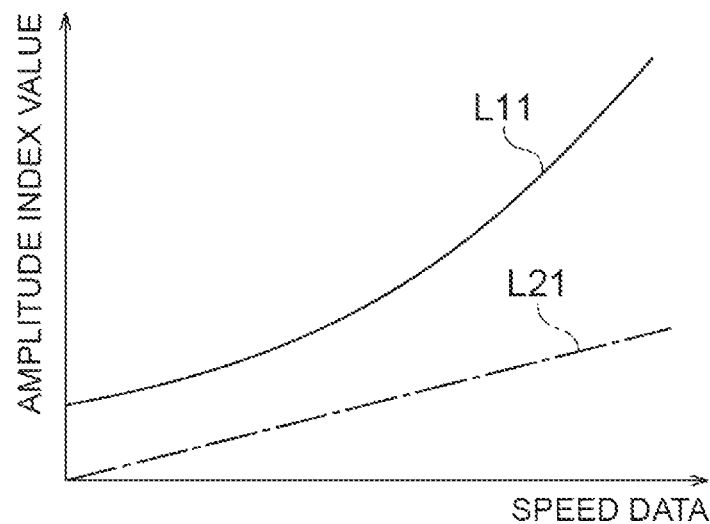

FIGS. 3A, 3B, and 3C are graphs illustrating the threshold lines, in which the horizontal axis represents the magnitude of the speed data and the vertical axis represents the magnitude of the amplitude index value. A line L21 schematically shows the relationship between the speed data and the amplitude index value in the normal state. The normal state means a state in which no irregularity such as a failure of the apparatus or a shortage of the fluid (for example, liquid) to be pressure-fed occurs, or a state in which the bearing is not deteriorated or damaged or the axis of the rotating shaft is not deviated. Hereinafter, the line L21 is referred to as "normal line L21". A line L11 indicates the threshold line. As shown in FIG. 3A, the threshold line L11 is set so that the amplitude threshold for each value of the speed data is larger than the amplitude index value in the normal state. In some cases, the threshold line L11 is set higher than the normal line L21.

As shown in FIGS. 3A, 3B, and 3C, the line L11 is set so that the amplitude threshold increases as the operating speed increases. As shown in FIG. 3B, the threshold line L11 may be set so that a difference between the amplitude threshold and the amplitude index value in the normal state increases as the speed data increases. In some cases, as the speed data increases, the gap between the threshold line L11 and the normal line L 21 may increase. As shown in FIG. 3C, the threshold line may be set so as to have a curved relationship with the speed data.

The threshold setting unit 125 is configured to set the amplitude threshold based on the operating speed. The threshold setting unit 125 is further configured to increase the amplitude threshold as the speed data increases. The threshold setting unit 125 may increase the difference between the amplitude threshold and the amplitude index value in the normal state as the speed data increases. For example, based on the latest speed data acquired by the data acquisition unit 121 and the threshold line stored in the threshold value memory 124, the threshold setting unit 125 may set the amplitude threshold corresponding to the latest speed data.

The irregularity detection unit 126 is configured to detect (identify) irregularity of the pumping apparatus 1 in response to determining that the amplitude index value (or the force oscillation level) exceeds the amplitude threshold. The irregularity detection here merely means to determine that the amplitude threshold is different from normal, and does not necessarily mean to detect the actual occurrence of an irregularity. The irregularity detection unit 126 may notify the host controller 300 that irregularity has been detected, or may display it on a display unit (for example, a liquid crystal monitor or a warning lamp) provided in the power conversion apparatus 100.

The power conversion apparatus 100 may be further configured to generate a threshold line (a threshold profile) based on user input. For example, as shown in FIG. 2, the power conversion apparatus 100 may further include an input data acquisition unit 131, an input data memory 132, and a line generation unit 133. The input data acquisition unit 131 is configured to acquire, from a setting computer 200, input data (hereinafter, "threshold input data") indicating correspondence between a value of speed data and an amplitude threshold corresponding to the value of speed data. The input data acquisition unit 131 may be configured to acquire two or more (e.g., three or more) sets of threshold input data having different values of speed data. The input data acquisition unit 131 may be configured to limit the range of speed data to which the threshold input data can be input. The input data memory 132 is configured to store the threshold input data acquired by the input data acquisition unit 131.

The line generation unit 133 is configured to generate a threshold line to interpolate between the two or more sets of threshold input data acquired by the input data acquisition unit 131. For example, the line generation unit 133 may derive a function based on the two or more sets of threshold input data by a linear function, a polynomial function, a spline function, or the like, or may provide a point sequence between the two or more sets of threshold input data by using these functions. Further, the line generation unit 133 may extrapolate the range of the two or more sets of threshold input data by a linear function, a polynomial function, a spline function, or the like. The extrapolation means that a function within a range of the two or more sets of threshold input data is extended and made into a function, or a point sequence is supplemented using the extended function.

The power conversion apparatus 100 may be further configured to generate a threshold line based on the speed data and the force data in the normal state. For example, the power conversion apparatus 100 may be further configured to generate the threshold line based on the speed data and the force data acquired during a test operation of the drive object. In this case, the power conversion apparatus 100 may be configured to provide electric power for a test operation to the motor 11 and generate the threshold line based on the speed data and the force data acquired during the test operation. For example, the power conversion apparatus 100 may further include a scan command memory 141, a scan control unit 142, a test data memory 144, and a line generation unit 145.

The scan command memory 141 is configured to store a speed command for the test operation for generating the threshold line. The speed command includes a plurality of speed command values. The scan control unit 142 is configured to provide electric power for test operation by the power conversion unit 111 to the motor 11. For example, the scan control unit 142 is configured to provide electric power for operating the motor 11 by the power conversion unit 111 to the motor 11 according to the speed command stored in the scan command memory 141. The test data memory 144 is configured to store the speed data acquired during the test operation and the amplitude index value derived by the index value derivation unit 123 based on the force data acquired during the test operation for each of the plurality of speed command values.

The line generation unit 145 is configured to generate the threshold line based on the speed data and the force data acquired during the test operation of the drive object in the normal state. For example, the line generation unit 145 may derive a reference profile (e.g., reference line L21 of FIGS. 3A, 3B, and 3C) representing a relationship between the operating speed (or the speed data) and the amplitude index value in the normal state based on the speed data and the amplitude index value acquired during the test operation and stored in the test data memory 144 in the normal state, and generates the threshold line based on the reference line. For example, the line generation unit 145 may generate a line obtained by adding a predetermined margin to the reference line as the threshold line. The power conversion apparatus 100 may be further configured to: derive the reference profile associated with a first rate of change of the force oscillation level as the operating speed is increased from the first speed to the second speed; and generate the threshold profile associated with a second rate of change of the oscillation threshold as the operating speed is increased from the first speed to the second speed, wherein the second rate of change is greater than the first rate of change. For example, the line generation unit 145 may increase the margin as the speed data increases. Thus, as the speed data increases, the gap between the amplitude threshold and the amplitude index value in the normal state increases.

Figure 4:
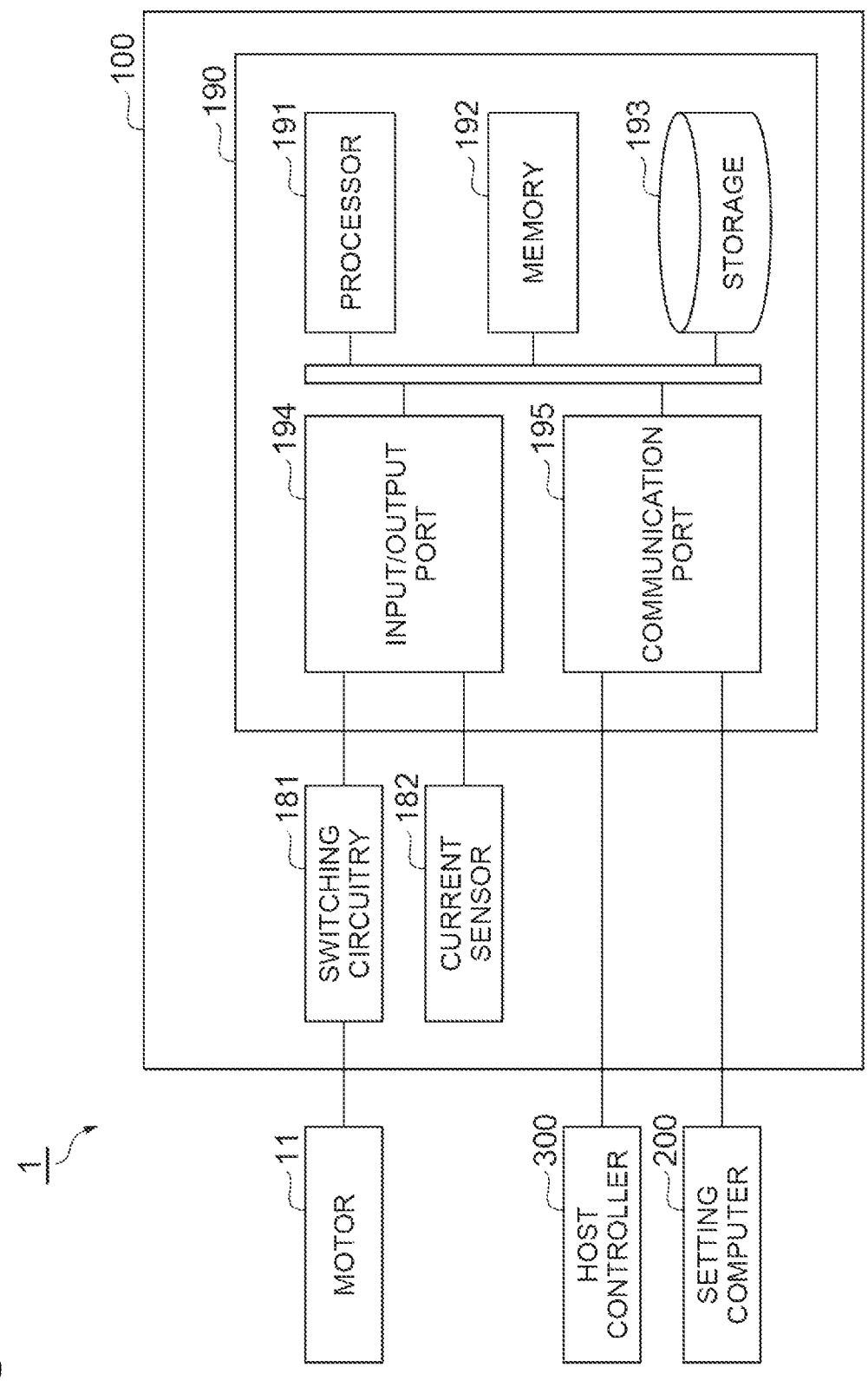
FIG. 4 is a hardware configuration diagram of the power conversion apparatus.

FIG. 4 is a block diagram illustrating a hardware configuration of the power conversion apparatus 100. As shown in FIG. 4, the power conversion apparatus 100 may include control circuitry 190, switching circuitry 181 (power conversion circuitry), and a current sensor 182.

The control circuitry 190 includes one or more processors 191, memory 192, storage 193, input/output ports 194, and communication ports 195. The storage 193 includes a computer-readable storage medium such as a nonvolatile semiconductor memory. The storage medium stores a program for configuring each of the above described functional modules of the power conversion apparatus 100. The memory 192 temporarily stores a program loaded from the storage medium of the storage 193 and an operation result by the one or more processors 191. The one or more processors 191 executes the program in cooperation with the memory 192 to configure each of the functional modules of the power conversion apparatus 100. The input/output ports 194 have a terminal block of an input power source, and input and output an electric signal between the switching circuitry 181 and the current sensor 182 in accordance with a command from the one or more processors 191. The communication ports 195 perform information communication with the setting computer 200 and the host controller 300 according to an instruction from the one or more processors 191.

It should be noted that the control circuitry 190 is not necessarily limited to one that configures each function by a program. For example, at least a part of the functions of the control circuitry 190 may be configured by a dedicated logic circuit or an application specific integrated circuit (ASIC) in which the dedicated logic circuit is integrated.

The switching circuitry 181 operates in accordance with a command from the control circuitry 190 (for example, an electric signal from the input/output ports 194), and functions as the power conversion unit 111. For example, the switching circuitry 181 outputs the driving electric power to the motor 11 by switching on and off a plurality of switching elements in accordance with an electric signal (for example, a gate signal) from the input/output port 194. The switching element is, for example, a power metal oxide semiconductor field effect transistor (MOSFET) or an insulated gate bipolar transistor (IGBT).

The current sensor 182 operates in accordance with a command from the control circuitry 190 (for example, an electric signal from the input/output port 194), and functions as the above-described current detection unit 114. The current sensor 182 detects the output current from the switching circuitry 181 to the motor 11.

Control Method

Next, a control sequence executed by the power conversion apparatus 100 will be described as an example of the control method. Hereinafter, the control sequence is divided into a generation sequence of the threshold line and an operation status monitor sequence, which will be described in detail.

Generation Sequence of Threshold Line

Figure 5:
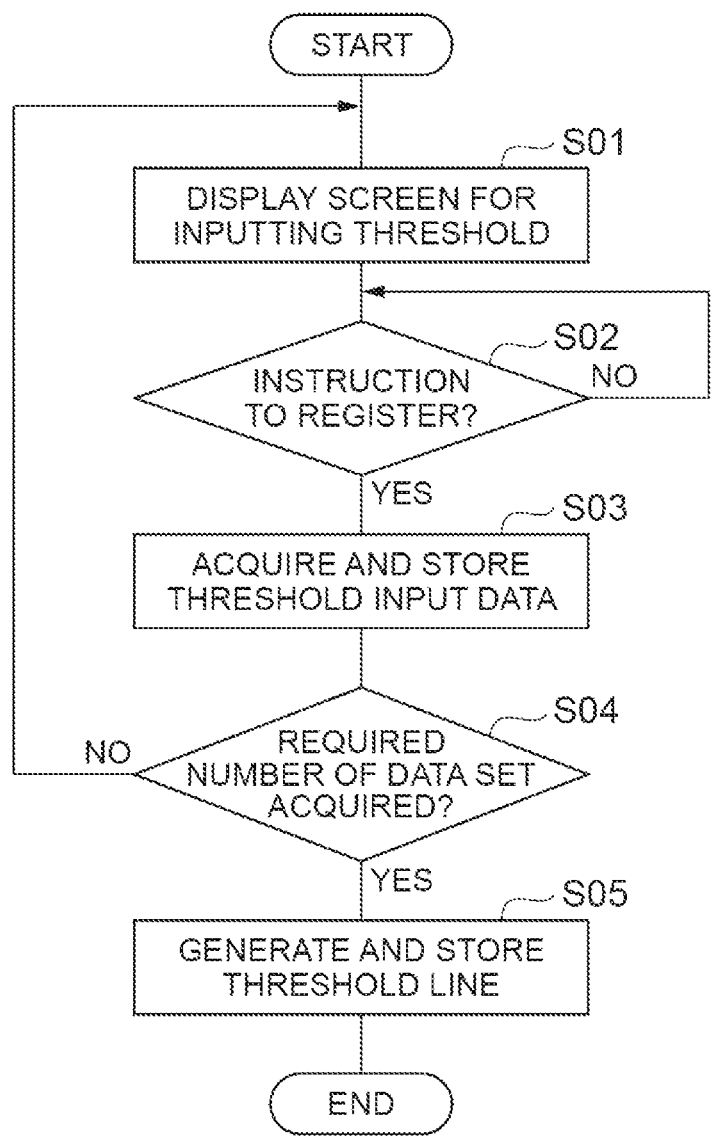
FIG. 5 is a flowchart illustrating a generation sequence of the threshold line.

As shown in FIG. 5, the power conversion apparatus 100 first executes operations S01, S02, and S03. In operation S01, the input data acquisition unit 131 displays a screen for acquiring the threshold input data (hereinafter, "threshold input screen") on the setting computer 200. In operation S02, the input data acquisition unit 131 waits for an instruction to register the threshold input data input to the threshold input screen. This registration instruction is input, for example, by operating (for example, clicking or tapping) a button on the threshold input screen in the setting computer 200. In operation S03, the input data acquisition unit 131 acquires threshold input data input to the threshold input screen from the setting computer 200 and stores the threshold input data in the input data memory 132.

Next, the power conversion apparatus 100 executes operation S04. In operation S04, the line generation unit 133 checks whether a sets of threshold input data necessary for generation of the threshold line has been acquired.

If it is determined in operation S04 that the sets of threshold input data necessary for generation of the threshold line has not been acquired, the power conversion apparatus 100 returns the process to operation S01. Thereafter, the acquisition of the threshold input data by the input data acquisition unit 131 is repeated until the sets of threshold input data necessary for the generation of the threshold line is acquired.

If it is determined in operation S04 that the sets of threshold input data necessary for generation of the threshold line has been acquired, the power conversion apparatus 100 executes operation S05. In operation S05, the line generation unit 133 generates a threshold line so as to interpolate between the sets of threshold input data acquired by the input data acquisition unit 131, and stores the generated threshold line in the threshold value memory 124. Then the generation sequence of the threshold line is completed.

Operation Status Monitor Sequence

Figure 6:
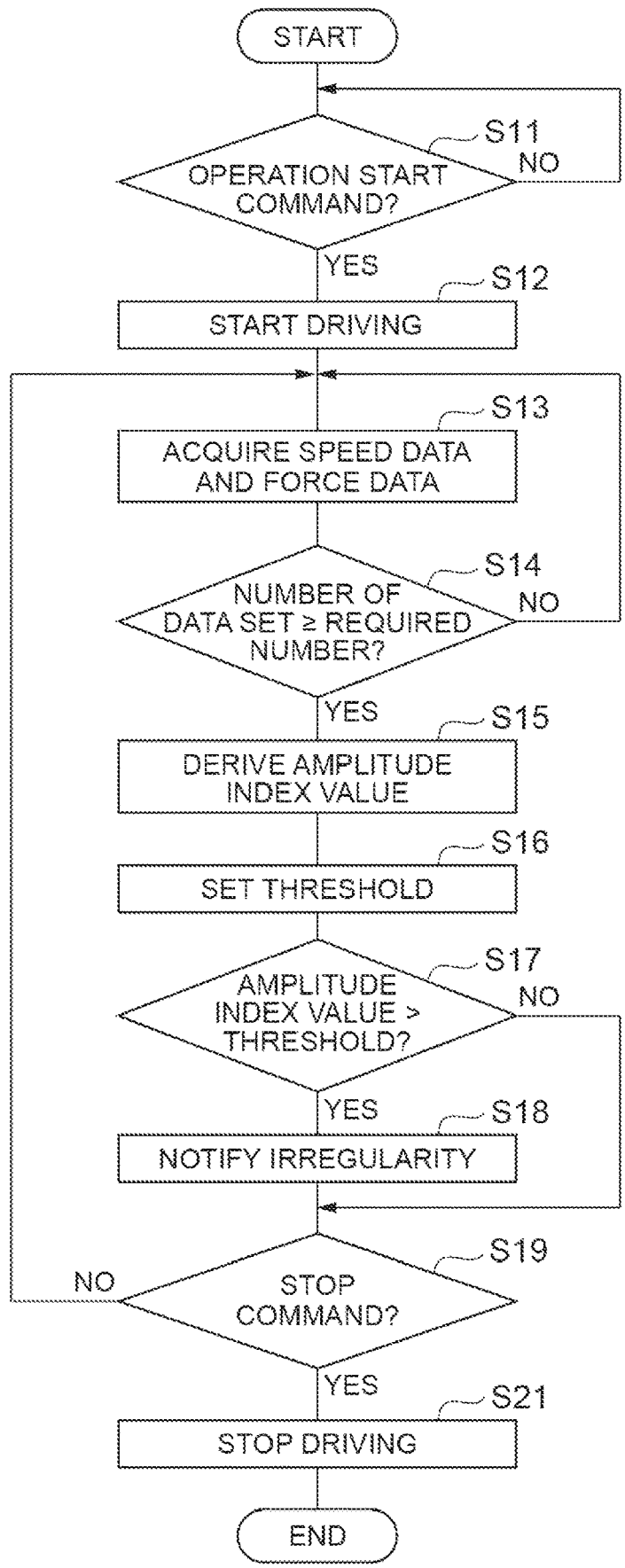
FIG. 6 is a flowchart illustrating an operation status monitor sequence.

As shown in FIG. 6, the power conversion apparatus 100 executes operations S11 and S12. In operation S11, the speed control unit 112 waits for an operation start command of the motor 11 from the host controller 300 or the like. In operation S12, the speed control unit 112 controls the power conversion unit 111 according to a command or the like from the host controller 300 to start the motor 11. For example, the speed control unit 112 starts the output of driving electric power by the power conversion unit 111 to the motor 11. Thereafter, the speed control unit 112 controls the power conversion unit 111 to output the driving electric power so that the driving speed of the pump 20 follows the target speed.

Next, the power conversion apparatus 100 executes operations S13 and S14. In operation S13, the data acquisition unit 121 acquires the speed data and the force data and stores them in the operation data memory 122. In operation S14, the index value derivation unit 123 checks whether or not the number of data sets required for deriving the amplitude index value (hereinafter simply referred to as the "required number") is stored in the operation data memory 122. If it is determined that the number of data sets accumulated in the operation data memory 122 has not reached the required number, the power conversion apparatus 100 returns the process to operation S13. Thereafter, the acquisition and storage of the speed data and the force data are repeated until the required number of time series data sets are accumulated in the operation data memory 122.

If it is determined in operation S14 that the necessary number of data sets have been accumulated in the operation data memory 122, the power conversion apparatus 100 executes operations S15 and S16. In operation S15, the index value derivation unit 123 derives (or identify) the amplitude index value based on the force data stored in the operation data memory 122. In operation S16, based on the latest speed data acquired by the data acquisition unit 121 and the threshold line stored in the threshold value memory 124, the threshold setting unit 125 sets the amplitude threshold corresponding to the latest speed data.

Next, the power conversion apparatus 100 executes operation S17. In operation S17, the irregularity detection unit 126 checks whether the amplitude index value derived in operation S15 exceeds the amplitude threshold set in operation S16. If it is determined that the amplitude index value exceeds the amplitude threshold, the power conversion apparatus 100 executes operation S18. In operation S18, the irregularity detection unit 126 notifies the host controller 300 that irregularity has been detected.

Next, the power conversion apparatus 100 executes operation S19. If it is determined in operation S17 that the amplitude index value does not exceed the amplitude threshold, the power conversion apparatus 100 executes operation S19 without executing operation S18. In operation S19, the speed control unit 112 checks whether there is a stop command of the motor 11 from the host controller 300 or the like. If it is determined in operation S19 that there is no stop command, the power conversion apparatus 100 returns the process to operation S13. Thereafter, the monitoring of the operation state of the pumping apparatus 1 is continued until there is a stop command of the motor 11. If it is determined in operation S19 that there is a stop command, the power conversion apparatus 100 executes operation S21. In operation S21, the speed control unit 112 controls the power conversion unit 111 to stop the motor 11. For example, the speed control unit 112 stops the output of the driving electric power by the power conversion unit 111 to the motor 11. Then the operation status monitor sequence is completed.

Modification of Threshold Line Generation Sequence

Figure 7:
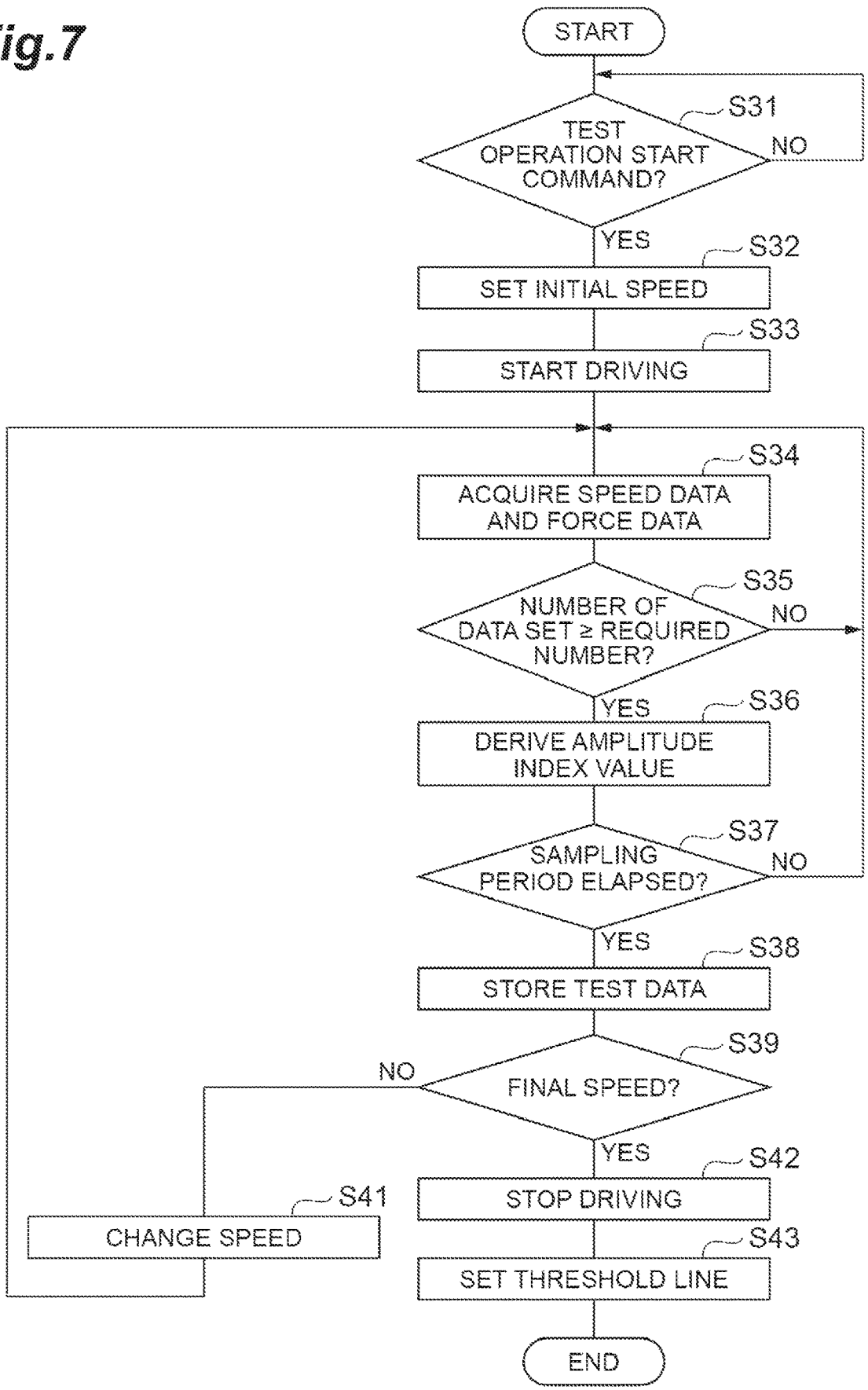
FIG. 7 is a flowchart illustrating a modification of the generation sequence of the threshold line.

Next, a modification of the generation sequence of the threshold line will be described. As shown in FIG. 7, the power conversion apparatus 100, first, executes operations S31, S32, and S33. In operation S31, the scan control unit 142 waits for a test operation start command of the motor 11 from the host controller 300 or the like. In operation S32, the scan control unit 142 sets the target speed of the motor 11 to the initial speed. For example, the scan control unit 142 sets the minimum value of the plurality of speed command values stored in the scan command memory 141 as the target speed. In operation S33, the scan control unit 142 requests the speed control unit 112 to start the speed control of the motor 11. The speed control unit 112 starts outputting the driving electric power by the power conversion unit 111 to the motor 11. Thereafter, the speed control unit 112 controls the power conversion unit 111 to output the driving electric power so that the operating speed of the pump 20 follows the target speed.

Next, the power conversion apparatus 100 repeats operations S34 and S35 similar to operations S13 and S14 until the required number of datasets are accumulated in the operation data memory 122. Next, the power conversion apparatus 100 executes operation S36. In operation S36, the index value derivation unit 123 derives the amplitude index value based on the force data stored in the operation data memory 122.

Next, the power conversion apparatus 100 executes operation S37. In operation S37, the scan control unit 142 checks whether a predetermined sampling period has elapsed. If it is determined that the sampling period has not elapsed, the power conversion apparatus 100 returns the process to operation S34. Thereafter, the acquisition of data and the derivation of the amplitude index value are repeated at a constant target speed until the sampling period elapses.

Next, the power conversion apparatus 100 executes operation S38. In operation S38, the index value derivation unit 123 stores the maximum value of the amplitude index value calculated during the sampling period and the speed data in the test data memory 144 in association with each other.

Next, the power conversion apparatus 100 executes operation S39. In operation S39, the scan control unit 142 checks whether the target speed of the motor 11 reaches a final speed. The final speed is, for example, the maximum value of the plurality of speed command values stored in the scan command memory 141. If it is determined that the target speed of the motor 11 has not reached the final speed, the power conversion apparatus 100 executes operation S41. In operation S41, the scan control unit 142 changes the target speed. For example, the scan control unit 142 sets, as the next target speed, a speed command value that is next to the speed command value currently set as the target speed in ascending order. Thereafter, the power conversion apparatus 100 returns the process to operation S34. Thereafter, the amplitude index value and the speed data are stored in the test data memory 144 for each speed command value until it is determined that the target speed has reached the final speed.

If it is determined in operation S41 that the target speed has reached a final speed, the power conversion apparatus 100 executes operations S42 and S43. In operation S42, the scan control unit 142 requests the speed control unit 112 to stop the motor 11. The speed control unit 112 stops the output of the driving electric power by the power conversion unit 111 to the motor 11. In operation S43, the line generation unit 145 derives the reference line based on the speed data and the amplitude index value stored in the test data memory 144, and generates the threshold line based on the reference line. The line generation unit 145 stores the generated threshold line in the threshold value memory 124. Then the setting of the threshold line is completed.

As described above, the power conversion apparatus 100 includes the power conversion unit 111 configured to provide electric power to the pumping apparatus 1, the data acquisition unit 121 configured to acquire speed data associated with the operating speed of the pumping apparatus 1 and force data associated with the drive force of the pumping apparatus 1, the threshold setting unit 125 configured to set the threshold of the amplitude index value associated with the oscillation amplitude of the force data, and the irregularity detection unit 126 configured to detect the irregularity of the drive object in response to the amplitude index value exceeding the threshold, wherein the threshold setting unit 125 increases the threshold as the speed data increases.

According to the power conversion apparatus 100, irregularity is detected based on the amplitude of oscillation of the force data. The relationship between the speed data and the force data may vary depending on the installation environment of the pumping apparatus 1. On the other hand, in the relationship between the speed data and the amplitude of oscillation, it is easy to find out the regularity independent of the installation environment or the like of the pumping apparatus 1. For example, in the normal state, the amplitude of oscillation tends to increase as the speed data increases. Accordingly, the threshold setting unit 125 increases the amplitude threshold as the speed data increases. As a result, the detection sensitivity of irregularity in the low-speed region may be increased while suppressing erroneous detection of irregularity in the high-speed region. In this way, by incorporating in advance a general logic that does not depend on the installation environment or the like, individual setting work according to the installation environment or the like may be reduced. Therefore, the irregular detect function may be easily constructed.

The threshold setting unit 125 may increase the difference between the threshold and the amplitude index value in the normal state as the speed data increases. In this case, both suppression of erroneous detection of irregularity in the high-speed region and improvement of detection sensitivity in the low-speed region may be achieved more reliably.

The power conversion apparatus 100 may further include the threshold value memory 124 configured to store the preset threshold line representing the relationship between the speed data and the threshold, and the threshold setting unit 125 may set the threshold based on the speed data and the threshold line L11. In this case, based on the threshold line, the amplitude threshold can be quickly set with a small calculation load.

The power conversion apparatus 100 may further include a line generation unit 145 configured to set the threshold line L11 based on the speed data and the force data in the normal state. In this case, the generation of the threshold line L11 is also executed by the power conversion apparatus 100. Therefore, the irregular detect function can be more easily constructed.

The line generation unit 145 may derive the reference line L21 indicating the relationship between the speed data and the amplitude index value in the normal state based on the speed data and the force data in the normal state, and generate the threshold line L11 based on the reference line L21. In this case, both suppression of erroneous detection of irregularity and improvement of detection sensitivity in each speed range may be achieved more reliably.

The power conversion apparatus 100 may further include a scan control unit 142 for providing electric power for a test operation from the power conversion unit 111 to the drive object, and the line generation unit 145 may generate the threshold line L11 based on speed data and force data acquired during the test operation. In this case, a preset test operation for setting the threshold line L11 is automatically executed by the power conversion apparatus 100. Therefore, the irregular detect function can be more easily constructed.

The power conversion apparatus 100 may further include an index value derivation unit 123 configured to derive amplitude of oscillation as an amplitude index value based on a plurality of force data acquired during a period from a predetermined length of time before the acquisition time of the force data to the acquisition time. In this case, the relationship with the amplitude threshold is confirmed after the amplitude itself is derived. Therefore, irregularity of the drive object can be detected with higher reliability.

The power conversion apparatus 100 may further include an index value derivation unit 123 configured to derive, as the amplitude index value, the difference between the force data and the trend value of the force data based on the past values of force data acquired during a period from a predetermined length of time before the acquisition time of the force data to the acquisition time. In this case, the irregularity of the drive object can be quickly detected even in a situation in which irregularity has occurred suddenly.

Figure 8:
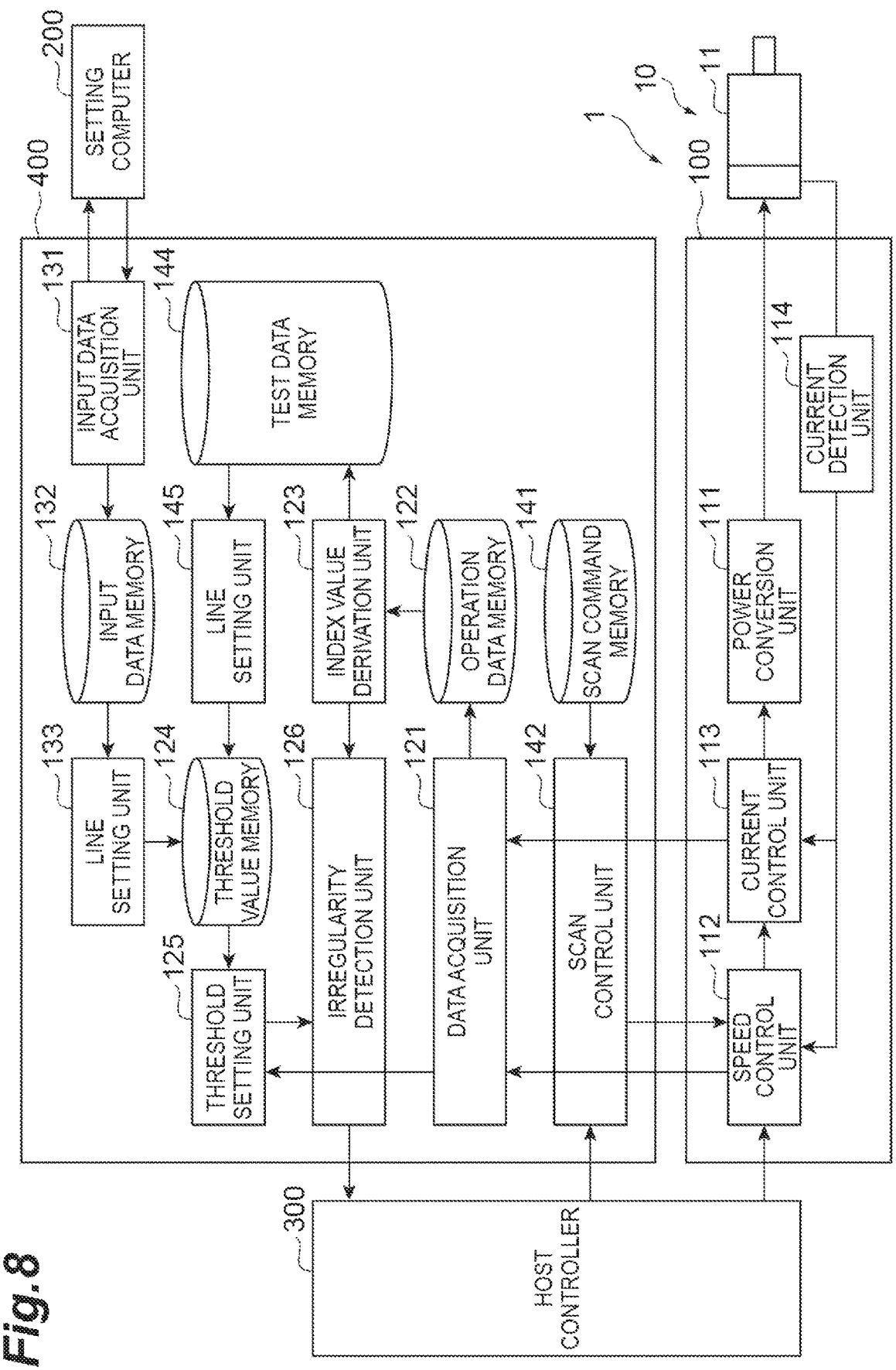
FIG. 8 is a block diagram illustrating a modification of a diagnostic apparatus.

Although the embodiments have been described above, the present invention is not necessarily limited to the above-described embodiments, and various modifications can be made without departing from the scope of the invention. In the above embodiment, the diagnostic apparatus of the pumping apparatus 1 configured to acquire force data associated with the drive force of the pumping apparatus 1 based on the electric power provided to the pumping apparatus 1 by the power conversion unit 111, set the threshold of the amplitude index value associated with the oscillation amplitude of the force data, and detect the irregularity of the pumping apparatus 1 in response to the amplitude index value exceeding the threshold, wherein the threshold is increased as an operating speed of the drive object increases, is incorporated in the power conversion apparatus 100 of the pumping apparatus 1. The diagnostic apparatus may be configured outside the pumping apparatus 1. For example, the diagnostic apparatus 400 shown in FIG. 8 is configured outside the pumping apparatus 1, and includes the data acquisition unit 121, the operation data memory 122, the index value derivation unit 123, the threshold value memory 124, the threshold setting unit 125, the irregularity detection unit 126, the input data acquisition unit 131, the input data memory 132, the line generation unit 133, the scan command memory 141, the scan control unit 142, and the test data memory 144. The diagnostic apparatus may be incorporated in the host controller 300. The electric drive object is not limited to the pumping apparatus 1. The electric drive object may be any object that uses an electric motor as a power source, such as a fan or a stirrer. The motor itself may be an electric drive object. In this case, it is possible to detect irregularity such as deterioration or damage of the bearing of the motor itself.

Although certain procedures or operations are described herein as being performed sequentially or in a particular order, in some examples one or more of the operations may be performed in a different order, in parallel, simultaneously with each other, or in an overlapping manner. Additionally, in some examples, one or more of the operations may be optionally performed or, in some cases, omitted altogether.

We claim all modifications and variations coining within the spirit and scope of the subject matter claimed herein.

What is claimed is:

1. A power conversion apparatus comprising:
   power conversion circuitry configured to provide electric power to a motor that generates torque for driving a drive object; and
   control circuitry configured to:
      control the power conversion circuitry to provide the electric power to the motor based, at least in part, on one or more control inputs;
      acquire torque data indicating a transition of the torque over time based, at least in part, on the one or more control inputs;
      identify an oscillation level indicating an oscillation magnitude of the torque based on the torque data;
      determine a variable oscillation threshold that varies with an operating speed of the motor;
      compare the oscillation level with the variable oscillation threshold; and
      identify an irregularity of the drive object in response to determining that the oscillation level corresponding to the torque that drives the drive object exceeds the variable oscillation threshold.

2. The power conversion apparatus according to claim 1, wherein the torque data comprise time series data of an electrical current associated with the electric power.

3. The power conversion apparatus according to claim 1, wherein the torque data comprise time series measurements of the torque.

4. The power conversion apparatus according to claim 1, wherein the control circuitry is further configured to determine the variable oscillation threshold based on a threshold profile representing a predetermined relationship between the operating speed of the motor and the variable oscillation threshold such that the variable oscillation threshold increases as the operating speed increases.

5. The power conversion apparatus according to claim 4, wherein the threshold profile comprises a function.

6. The power conversion apparatus according to claim 4, wherein the threshold profile comprises a discrete point sequence.

7. The power conversion apparatus according to claim 4, wherein the control circuitry is further configured to generate the threshold profile based on the torque data acquired during a test operation of the motor and determine the variable oscillation threshold based on the threshold profile after the test operation.

8. The power conversion apparatus according to claim 7, wherein the control circuitry is further configured to derive a reference profile representing a relationship between the operating speed and the oscillation level based on the torque data acquired during the test operation, and generate the threshold profile based on the reference profile.

9. The power conversion apparatus according to claim 8, wherein the control circuitry is further configured to:
   derive the reference profile associated with a first rate of change of the oscillation level as the operating speed is increased from a first speed to a second speed; and
   generate the threshold profile associated with a second rate of change of the variable oscillation threshold as the operating speed is increased from the first speed to the second speed, wherein the second rate of change is greater than the first rate of change.

10. The power conversion apparatus according to claim 1, wherein the control circuitry is further configured to calculate a trend value of the torque data and calculate a difference between an instantaneous value of the torque data and the trend value as the oscillation level.

11. The power conversion apparatus according to claim 10, wherein the control circuitry is further configured to calculate the trend value by low-pass filtering on the torque data.

12. The power conversion apparatus according to claim 1, wherein the control circuitry is further configured to control the power conversion circuitry to change the electric power in order to modulate an operating speed of the motor.

13. A pumping apparatus comprising:
    an electric pump;
    a motor configured to provide torque to the electric pump;
    power conversion circuitry configured to provide electric power to the motor for generating the torque; and
    control circuitry configured to:
       control the power conversion circuitry to provide the electric power to the motor based, at least in part, on one or more control inputs;
       acquire torque data indicating a transition of the torque over time based, at least in part, on the one or more control inputs;
       identify an oscillation level indicating an oscillation magnitude of the torque based on the torque data;
       determine a variable oscillation threshold that varies with an operating speed of the motor;
       compare the oscillation level with the variable oscillation threshold; and
       identify an irregularity of the electric pump in response to determining that the oscillation level corresponding to the torque that drives the electric pump exceeds the variable oscillation threshold.

14. The pumping apparatus according to claim 13, further comprising an electrical component holder fixed to the electric pump to hold the power conversion circuitry and the control circuitry.

15. The pumping apparatus according to claim 13, wherein the control circuitry is configured to determine the variable oscillation threshold based on a threshold profile representing a predetermined relationship between the operating speed of the motor and the variable oscillation threshold such that the variable oscillation threshold increases as the operating speed increases.

16. The pumping apparatus according to claim 15, wherein the circuitry is further configured to generate the threshold profile based on the torque data acquired during a test operation of the motor, and to determine the variable oscillation threshold based on the threshold profile after the test operation.

17. A diagnostic method for a drive object driven by torque generated by a motor, the diagnostic method comprising:
    acquiring torque data indicating a transition of the torque over time;
    identifying an oscillation level indicating an oscillation magnitude of the torque based on the torque data;

determining a variable oscillation threshold that varies with an operating speed of the motor;

comparing the oscillation level with the variable oscillation threshold; and identifying an irregularity of the drive object in response to determining that the oscillation level corresponding to the torque that drives the drive object exceeds the variable oscillation threshold.

18. The diagnostic method according to claim 17, wherein the torque data comprise time series data of an electrical current provided to the motor for generating the torque.

19. The diagnostic method according to claim 17, wherein determining the variable oscillation threshold comprises determining the variable oscillation threshold based on a threshold profile representing a predetermined relationship between the operating speed of the motor and the variable oscillation threshold such that the variable oscillation threshold increases as the operating speed increases.

20. The diagnostic method according to claim 17, further comprising generating the threshold profile based on the torque data acquired during a test operation of the motor.

\* \* \* \* \*